United States Patent
Miller et al.

(10) Patent No.: US 6,853,191 B1
(45) Date of Patent: Feb. 8, 2005

(54) METHOD OF REMOVING DYNAMIC NONLINEAR PHASE ERRORS FROM MRI DATA

(75) Inventors: Karla L. Miller, San Francisco, CA (US); John M. Pauly, Redwood City, CA (US)

(73) Assignee: The Board of Trustees of The Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/733,011

(22) Filed: Dec. 10, 2003

(51) Int. Cl.[7] .................................................. G01V 3/00
(52) U.S. Cl. ......................................... 324/309; 324/307
(58) Field of Search ................................ 324/309, 307, 324/306, 312, 314, 300; 600/410

(56) References Cited

U.S. PATENT DOCUMENTS

| | | | | |
|---|---|---|---|---|
| 5,581,184 A | * | 12/1996 | Heid ............................ | 324/309 |
| 6,275,720 B1 | * | 8/2001 | Du et al. ..................... | 600/410 |
| 6,292,683 B1 | * | 9/2001 | Gupta et al. ................. | 600/410 |
| 6,321,107 B1 | * | 11/2001 | Derbyshire ................... | 600/410 |

OTHER PUBLICATIONS

Miller, Karen and Panly, John, "Nonlinear Navigated Motion Correction for Diffusion Imaging", 10th Scientific Meeting of ISMRM, Honolulu, 2002, 1 page.

Miller, Karen and Pauly, John, "Nonlinear Phase Correction for Diffusion Imaging" Magnetic Resonance in Medicine, vol. 50, pp. 343–353, 2003.

* cited by examiner

Primary Examiner—Louis Arana
(74) Attorney, Agent, or Firm—Beyer Weaver & Thomas LLP (57) ABSTRACT

Disclosed is a generalized reconstruction method that corrects for non-linear phase errors based on least-squares estimation. An approximation of the least squares estimate utilizes refocusing reconstruction in which high-resolution data is multiplied by the phase conjugate of a navigator in image-space. The multiplication rephases the unaliased signal in the high-resolution data. The high-resolution data can then be added together coherently. The multiplication can be effected in k-space as a convolution using a gridding reconstruction of the high-resolution data using the low resolution navigator.

12 Claims, 8 Drawing Sheets

Diagram of the least-squares matrix reconstruction

Illustration of the effects of motion on DW magnetization

*FIG. 1*

FIG. 2
Diagram of the least-squares matrix reconstruction

Block diagram of refocusing reconstruction
*FIG. 3*

The effect of 2DFT phase-encode ordering on k-space

*FIG. 4*

Navigated steady-state DWI pulse sequence

*FIG. 5*

Untriggered spiral-navigated 2DFT images

*FIG. 6*

Cardiac-synchronized, spiral-navigated 2DFT images

*FIG. 7*

Navigated SS-DWI images

*FIG. 8*

Impulse responses of the mixing operator for a 2DFT acquisition

FIG. 9

Simulated impulse response magnitude of the mixing operator for a 2DFT

FIG. 10

METHOD OF REMOVING DYNAMIC NONLINEAR PHASE ERRORS FROM MRI DATA

The U.S. government has rights in the claimed invention pursuant to NIH grant no. IP41 RR09784 to Stanford University.

BACKGROUND OF THEE INVENTION

This invention relates generally to magnetic resonance imaging (MRI), and more particularly the invention relates to removing phase errors in MRI data.

Magnetic Resonance Imaging (MRI) is based on careful manipulation of phase information in the NMR signal. Phase errors are therefore a significant problem in MRI. The correction of static phase errors, as may arise from magnetic field inhomogeneties has been extensively studied. However, the more complicated situation of time-varying phase errors has been incompletely treated. This set of problems involves phase errors which vary from readout to readout.

Imaging situations that require the correction of time-varying phase offsets include diffusion-weighted imaging (DWI), multi-coil imaging with time-varying coil sensitivity patterns and moving-table imaging with time-varying field maps.

As an example, consider diffusion-weighted imaging. When DWI data is gathered in a multi-shot acquisition, bulk motion introduces varying phase shifts following different excitations. These phase errors are problematic for multi-shot acquisitions because each readout experiences a different image-space phase corruption, causing phase interference when readouts are combined to form a high-resolution image. Navigated techniques correct phase errors based on a low resolution phase reference (or navigator) that is acquired along with each high-resolution data frame.

Navigated DWI methods typically assume rigid-body motion, the effects of which have been well characterized. However, a significant component of brain motion is non-rigid. During systole, the brain deforms about the ventricles and displaces inferiorly through the foramen magnum as though being pulled by the spinal cord. The more superior and lateral regions of the brain are nearly motionless, whereas the more inferior and medial regions tend to experience large displacements. Even during the relative quiescence of diastole, motion induced by the cardiac cycle follows this nonlinear spatial pattern as the brain slowly returns to its resting position.

Figure 1:
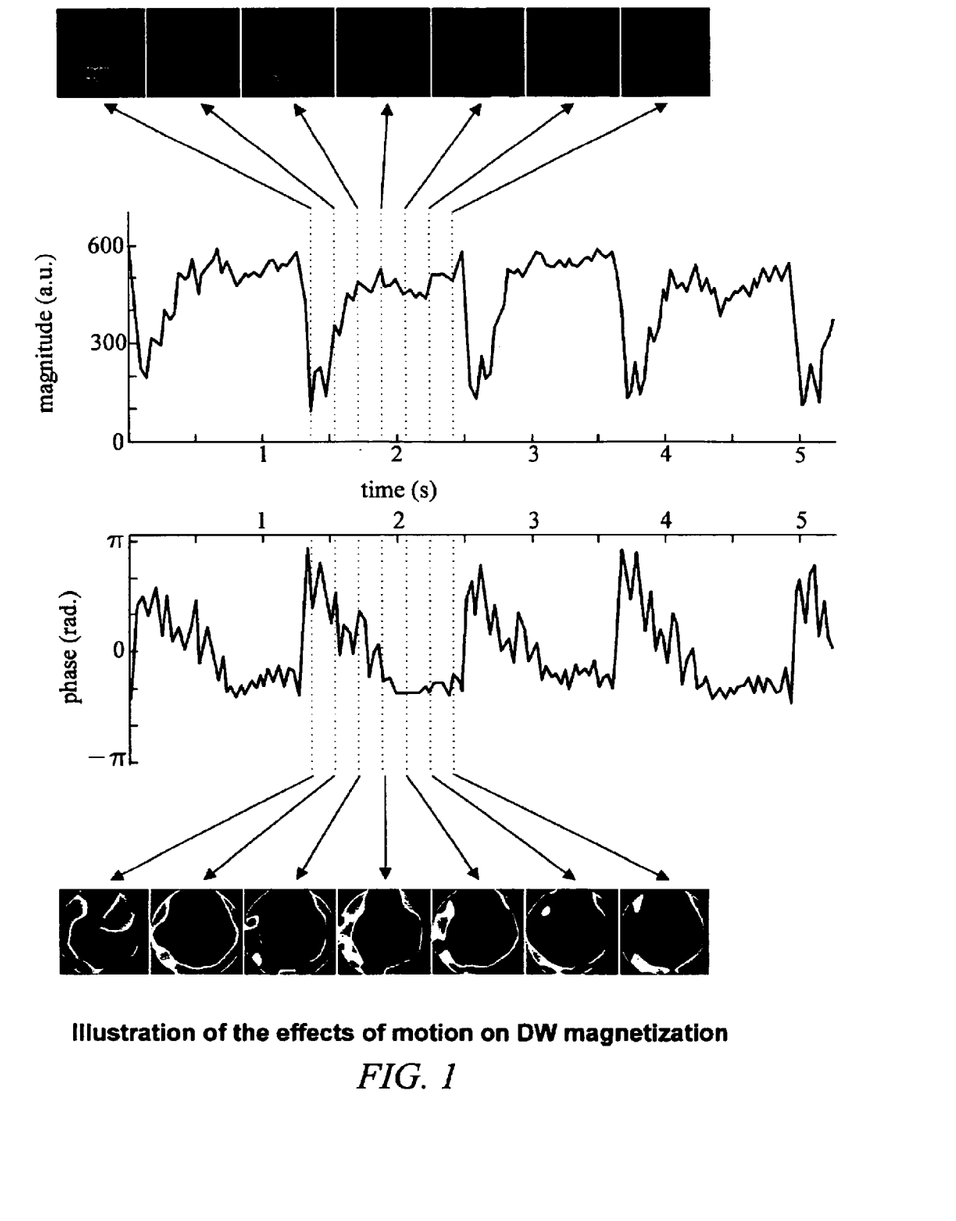
FIG. 1 is an illustration of the effects of motion on diffusion-weighted magnetization.

In the presence of diffusion-weighted gradients, these deformations can cause phase corruptions that vary nonlinearly across the object magnetization. The effect of brain motion on the DWI signal is shown in FIG. 1, which is an illustration of the effects of motion on diffusion-weighted magnetization. The magnitude (top) and phase (bottom) of a series of low-resolution axial single-shot DWI images (2D navigators) are shown over a single cardiac cycle. The magnitude and phase of a representative voxel are plotted in the middle over four cardiac cycles. The spatial variation in the image magnitude and phase is nonlinear and strongly correlated to the cardiac cycle. The signal phase and amplitude are correlated with the cardiac cycle and exhibit non-linear spatial variation. The loss in signal amplitude during peak systole is due to intravoxel dephasing caused y intense motion. The highly focal nature of this dephasing highlights the spatial nonlinearity of phase corruptions.

These phase errors are problematic for multi-shot acquisitions because each readout experiences a different image-space phase corruption ($\phi_j(r)$ for the $j^{th}$ readout). This causes phase interference when readouts are combined to form a high-resolution image. Navigated techniques correct phase errors with low-resolution navigator data that is acquired along with each high-resolution data frame. Provided the navigator data (a) samples the same phase error $\phi_j(r)$ as the high-resolution data, and (b) covers k-space sufficiently to resolve $\phi_j(r)$, the navigator can be used to correct phase errors in the high-resolution data before the interleaves are combined. Based on the assumption of rigid-body motion, standard navigator methods correct for $0^{th}$ and $1^{st}$ order phase terms. In the presence of the non-linear errors described above, a rigid-body correction is a first-order approximation to the desired high-order correction. Given that a 2D navigator contains high-order phase information, image reconstruction should be improved by correcting for higher-order phase terms.

SUMMARY OF THE INVENTION

The present invention provides a generalized reconstruction method that corrects for nonlinear phase errors using a low-resolution phase reference (or navigator) based on a least-squares estimation. While the full least-squares estimate requires prohibitive amount of computation, we have developed an efficient approximation called the "refocusing reconstruction". The refocusing reconstruction multiplies the high-resolution data by the phase conjugate of the navigator in image-space. This multiplication rephases the unaliased signal in the high-resolution data. The high-resolution data can then be added together, since the data frames have been rephased to add coherently (that is, the data has been "refocused").

In practice, it is much faster to refocus the data in k-space as a convolution (which is equivalent to a multiplication in image space). This correction is essentially a "gridding" reconstruction, which is very fast. For the situation where phase errors are caused by periodic motions (such as cardiac or respiratory motion), we also propose a time-efficient approach to gating that improves the performance of the refocusing reconstruction.

The invention is able to remove linear and nonlinear phase artifacts. Previous navigator methods have only been able to remove linear artifacts. However, nonlinear phase artifacts often dominate the linear phase errors. For example, nonlinear phase artifacts are highly prevalent in the brain (the primary organ of interest in DWI) due to cardiac pulsations. Similarly, coil sensitivity patterns are in general nonlinear, as are field maps.

The refocusing reconstruction has the ability to correct these artifacts without incurring the large computation times that the full (least-squares) solution would require. The k-space version of the algorithm is faster than image-space refocusing because it can be incorporated into standard gridding operations.

Further, in cases where the sources of phase artifacts are predictable or measurable, the refocusing reconstruction can be improved by ordering data frame acquisition to create smooth, non-periodic modulations in k-space. For example, in DWI cardiac triggering information can improve the refocused image without requiring the large increases in scan time often associated with cardiac triggering.

The invention and objects and features thereof will be more apparent from the following description and appended claims when taken with the drawings.

DETAILED DESCRIPTION OF ILLUSTRATED EMBODIMENTS

The invention provides for the correction of spatially-nonlinear phase artifacts that vary from readout to readout in multi-shot MRI acquisitions. The method uses a gridding kernel based on low-resolution phase references (navigators) for high-resolution, multi-shot data. This gridding operation removes the phase artifacts from each high-resolution data frame. The phase-corrected data frames can then be combined to produce an artifact-free image.

The invention includes a way to improve the performance of the correction by ordering the data frames to promote smooth, non-periodic modulations in the k-space data. For example, triggering information can be used in DWI to determine the order in which k-space data is gathered. This ordering causes cardiac motions to introduce smooth, non-periodic modulation in the k-space data. This ordering improves the correction performed by the gridding kernel by avoiding the types of errors that the correction has difficulty removing.

The refocusing reconstruction method comprises the following requirements: acquisition of a low-resolution phase reference (navigator) with each high-resolution data frame; calculation for each data frame the "refocusing kernel" (the Fourier transform of the phase conjugate of the navigator image); convolution in k-space of the high resolution data frame with the refocusing kernel; and summation of the phase-corrected, high resolution data frames.

The frame-ordering method comprises the following requirements: acquisition of systolic triggering information or other information relevant to time-varying data corruption; and ordering of data frames based on this information to promote smooth, non-periodic modulation of data in the spectral domain.

Potential applications include removal of motion-induced phase errors in diffusion-weighted imaging, reconstruction of multi-coil (parallel) imaging data with fluctuating coil sensitivity patterns, and off resonance correction of moving-table MR images.

The following considers first the effect of nonlinear phase corruption on diffusion-weighted data and derive a nonlinear phase correction based on least-squares estimation. Computational issues require that the least-squares reconstruction be approximated, and an approximation called the "refocusing reconstruction" is presented. This reconstruction can be performed in either image space or k space. The invention comprises the k-space reconstruction.

Phase corruption can be expressed at each point in image space as a multiplication of the magnetization by a phase function and can be described conveniently using matrix formalism. For an arbitrary trajectory that covers k-space in C interleaves of length R, corresponding to an N×N image, the acquired data is:

$$d = GFPm = RPm \quad (1)$$

where d is a C R×1 vector containing the k-space data, m is a $N^2 \times 1$ vector containing the object magnetization in Cartesian coordinates, and P ($CN^2 \times N^2$), F ($CN^2 \times CN^2$) and G ($CR \times CN^2$) are matrices respectively representing image-space phase corruption, discrete Fourier transform, and resampling from a Cartesian grid onto the k-space trajectory. The phase corruption matrix P is a stack of diagonal matrices containing the phase corruption for each readout. This phase corruption is measured by the navigator phase, which must be interpolated to match the high-resolution readout (since the n×n navigator is of lower resolution than the high-resolution readout). The matrix R=GF describes the basis set used in the k-space trajectory. Expressions for these vectors and matrices are given in Appendix A attached hereto.

Figure 2:
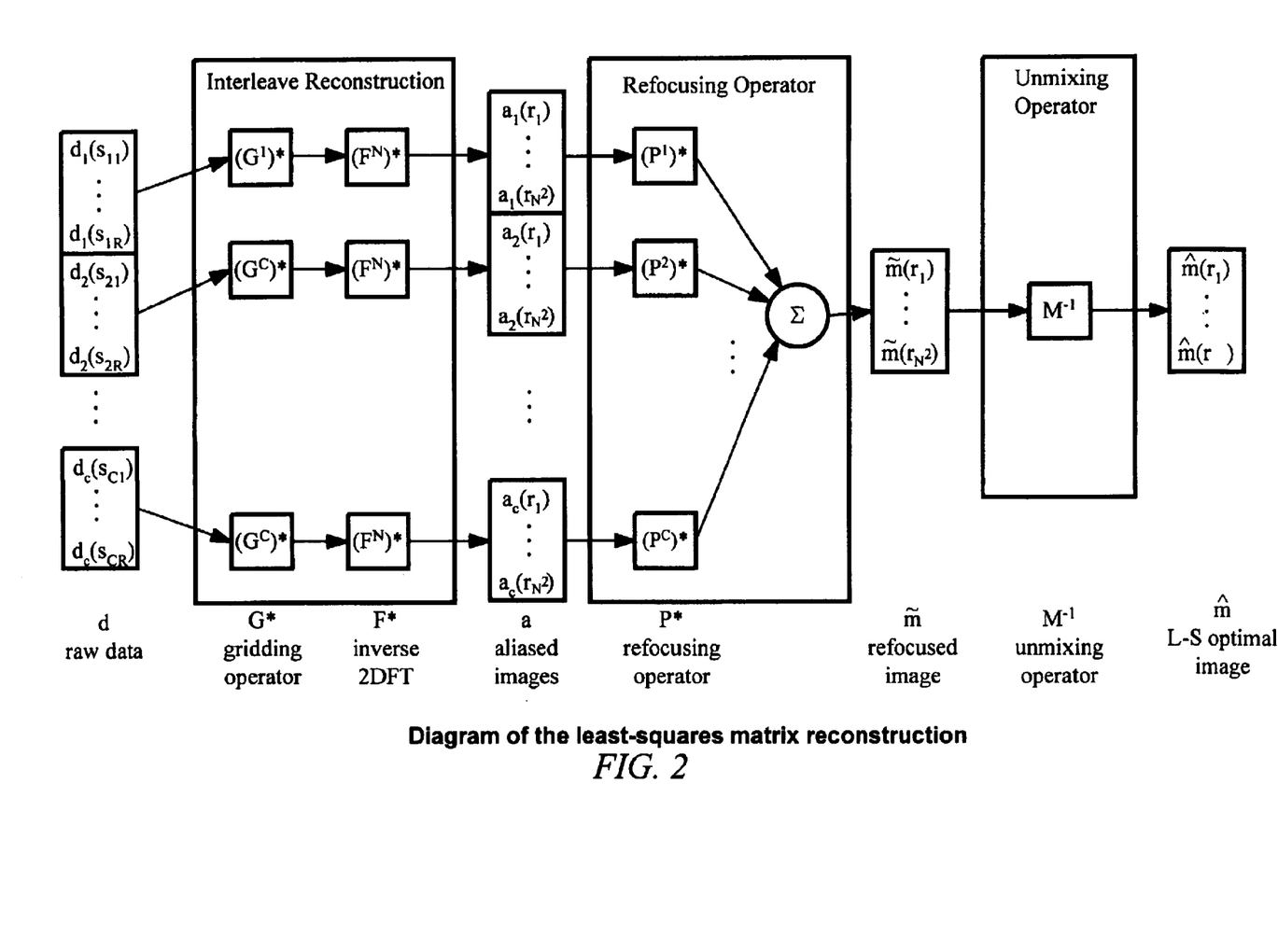
FIG. 2 is a diagram of least-squares reconstruction of phase corrupted image data.

The magnetization can be estimated from the data in Eq. 1 using least-squares. Assuming an accurate measurement of the phase errors P, the least-squares reconstruction is:

$$\hat{m} = (P^*R^*RP)^{-1}P^*R^*d = M^{-1}P^*R^*d \quad (2)$$

where * denotes conjugate transpose. It is helpful to consider this reconstruction as occurring in three steps: (1) reconstruction R* of the individual data frames in image-space, which we call the "interleave reconstruction"; (2) phase correction P*, which we call the "refocusing operator"; and (3) removal of remaining artifacts by $M^{-1} = (P^*R^*RP)^{-1}$, which we call the "unmixing operator". These steps are diagrammed in FIG. 2 using the notation described in this section and in Appendix A. FIG. 2 illustrates a diagram of the least-squares matrix reconstruction given in Eq. 2. Each raw data interleave $d_j$ is gridded and inverse Fourier-transformed by the interleave reconstruction to form an aliased image $a_j$. These images are phase-corrected and summed by the refocusing operator to form the refocused image $\tilde{m}$. Remaining aliased energy is removed by the unmixing operator $M^{-1}$ to give the least-squares optimal image $\hat{m}$. If the aliased energy in the refocused image is sufficiently low, the reconstruction can stop at $\tilde{m}$, avoiding the computationally expensive inverse calculation $M^{-1}$. In this case, we call the algorithm a "refocusing reconstruction".

The data is first partially reconstructed using the interleave reconstruction $R^* = F^*G^*$, which separately resamples each readout onto a Cartesian grid at the high resolution readout size and inverse Fourier transforms the resampled data without combining the interleaves. The resulting vector $a = R^*d$ contains the image-space data corresponding to each readout of k-space data. Unless each readout covers a full field-of-view (FOV), the images in the vector a are aliased.

In the next step, the refocusing operator $P^*$ is applied to the interleave images to yield the refocused image $\tilde{m} = P^*a$.

The refocusing operator performs the essential task of rephrasing the interleaves based on the phase corruption measured by the navigator. Each interleave image is multiplied by the phase conjugate of the corresponding navigator image to rephase the unaliased component. The sum of these rephased interleaves is the refocused image. Although the unaliased components will add coherently in this summation, the aliased components will not necessarily cancel since the orthogonality of the Fourier encoding has been disturbed. The refocused image is thus the desired image plus some aliased artifact. To the extent that the phase errors are random, this aliased energy will be incoherent and will tend to phase cancel. The characterization and minimization of the aliased signal is discussed below.

The final step of the least-squares reconstruction is the application of the unmixing operator $M^{-1}$ to the refocused image. The unmixing operator removes two artifacts from the refocused image: non-uniformities in the sampling trajectory and motion-induced aliasing (see Appendix B). The compensation for trajectory non-uniformities, a standard correction in the least-squares reconstruction of non-Cartesian data, will be neglected here. More important to the invention is the removal of the aliased energy discussed above. The unmixing operator uses a linear combination of voxel signals to remove this coupling between voxels. If the refocused image contains little aliasing, the mixing matrix is close to the identity matrix.

Calculation of the unmixing operator $M^{-1}$ is problematic due to its computational complexity. Not only is the $N^2 \times N^2$ inversion computationally expensive, it also cannot be pre-computed because it depends on the phase corruptions. Further, the calculation of the mixing matrix M itself requires $C\ RN^2 = N^4$ operations for each element of the $N^2 \times N^2$ matrix (see Eq. 13). These computational requirements make direct calculation of the unmixing matrix (and hence the fill least-squares reconstruction) intractable.

If the sources of coupling are sufficiently low, the mixing matrix has little off-diagonal energy and is close to the identity matrix. Approximating the mixing matrix as the identity yields the "refocusing reconstruction":

$$\tilde{m} = P^* R^* d \qquad (3).$$

Provided the unmixing matrix is nearly diagonal, the refocusing reconstruction is a good approximation to the least-squares estimate which is much faster to compute. The refocusing reconstruction is also conceptually elegant: before the readouts are combined, each readout is refocused in image space by multiplication with the navigator phase conjugate. This interpretation is not only computationally useful, but also suggests a more efficient algorithm than the matrix computation in Eq. 3 for refocusing the data. This algorithm will be discussed later.

Some important properties of the refocusing reconstruction can be understood by considering the problem in k-space. Corruption by a spatial phase function ($e^{i\phi(\tau)}$) is equivalent to convolution by the transform of that phase function ($\int \{e^{i\phi(\tau)}\}$) in the spectral domain. If all of k-space were convolved with the same phase corruption kernel, we could restore the original spectrum by deconvolving with this kernel. However, in motion-corrupted DWI data, each readout samples a spectrum that has been convolved with a different kernel ($\mathcal{F}\{e^{i\phi}\mathcal{F}(\tau)\}$ for the $j^{th}$ readout).

Interpreted in k-space, the refocusing operator deconvolves each interleave separately using the phase-corruption kernel from that excitation. Refocusing uses the correct deconvolution kernel for points from the same excitation. For data from different excitations, the deconvolution will work well if the kernels are similar for adjacent positions in k-space, but will be unable to remove artifacts if the kernels are dissimilar. Hence, it is desirable for the kernel to change slowly and smoothly over k-space so that deconvolution is locally consistent. An additional concern is periodicity in the phase corruptions that cause a periodic weighting of the data in k-space. Any residual periodicity left by the refocusing operator will cause coherent ghosts, which are a more disruptive artifact than the diffuse aliasing associated with discontinuities. The refocusing reconstruction will produce high fidelity images when phase corruptions are smooth and non-periodic in k-space.

Figure 3:
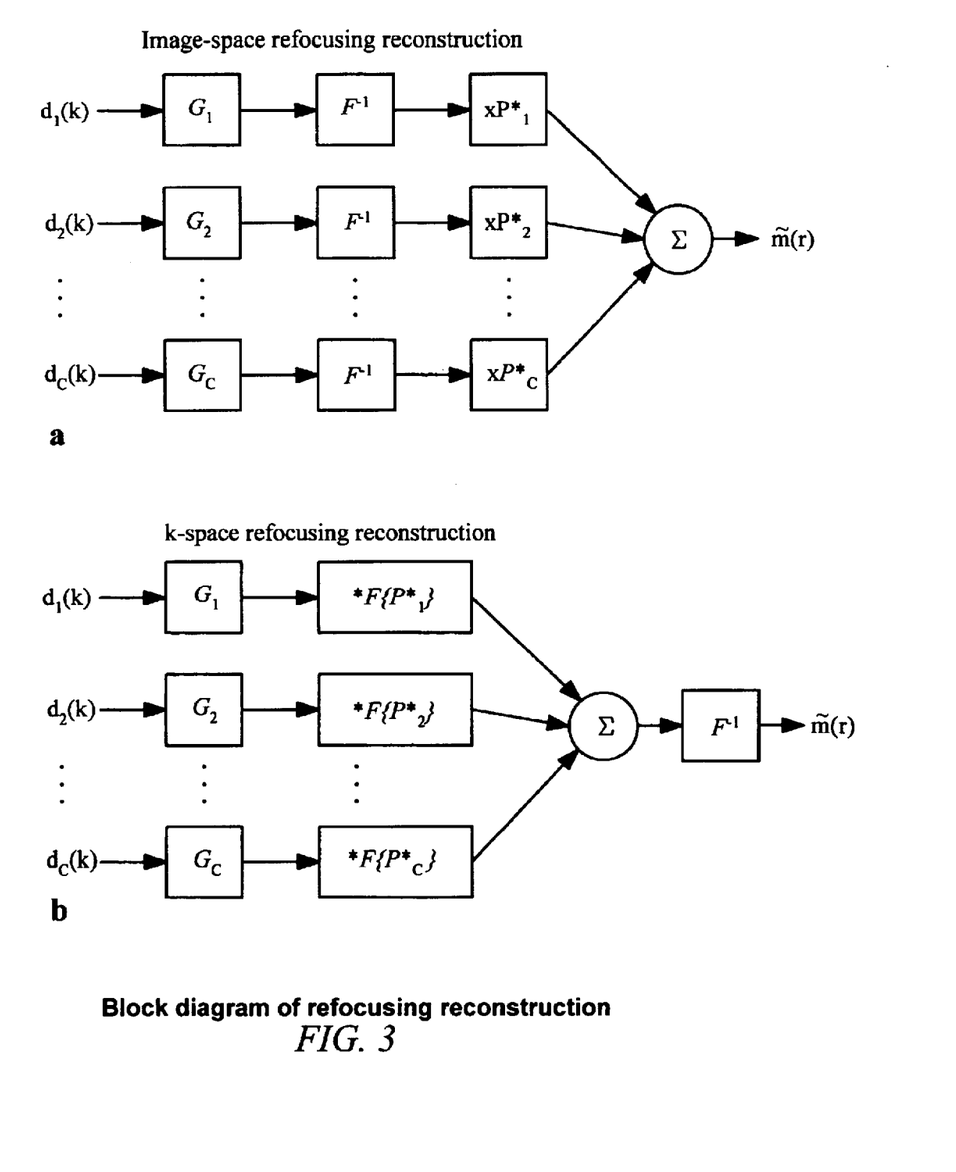
FIG. 3 is a block diagram of refocusing reconstruction in (a) image space and (b) k-space.

Although the matrix formulation given above is a useful way to derive the refocusing algorithm, it is an inefficient method for calculating the refocused image. Directly implementing the matrix formulation has prohibitive memory requirements and is unlikely to take full advantage of the highly structured nature of these matrices. It is much more efficient to use operations equivalent to those given in the matrix formulation, since these operations often have highly-optimized algorithms (such as the Fast Fourier Transform). The implementation of image-space refocusing shown in FIG. 3a can be calculated more efficiently than the matrix calculation of $\overline{m}$ shown in FIG. 2. Refocusing can also be implemented as a k-space deconvolution, as shown in FIG. 3b. FIG. 3 illustrates a block diagram of two versions of the refocusing reconstruction in which refocusing is performed in (a) image space and (b) k-space. The boxed expressions indicate the operations of gridding ($C_{ij}$ grids the $j^{th}$ readout trajectory), inverse Fourier transform ($\mathcal{F}^{-1}$) and refocusing (multiplication by $\mathcal{P}^*_j(r) = e^{-i\phi j(r)}$ in image-space or convolution by $\mathcal{F}\{\rho^*_j\}$ in k-space).

The image-space refocusing algorithm in FIG. 3a involves the following steps:

1. Initialize a zero-filled N×N matrix (which accumulates the refocused image).
2. For each interleave:
    (a) Reconstruct the navigator data in k-space (n×n).
    (b) Zero-pad (a) to the final image resolution (N×N).
    (c) Inverse Fourier transform (b) (to get the navigator image).
    (d) Reconstruct the high-resolution data frame in k-space at the final image resolution (N×N).
    (e) Inverse Fourier transform (d) (to get the interleave image).
    (f) Multiply (e) by the phase conjugate of (c) (refocusing step).
    (g) Add (f) to the sum accumulating in step 1.
3. The refocused image is the cumulative sum from (g).

For every interleave, this reconstruction requires two Fourier transforms and a matrix multiplication at the high-resolution matrix size (N×N). Each Fourier transform requires time $N^2 \log N^2$, and the matrix multiplication requires time $N^3$ for a total complexity of $O(CN^2 \log N^2 + CN^3) = O(CN^3)$.

The k-space refocusing algorithm (FIG. 3b) is:

1. Initialize a zero-filled N×N matrix (which will accumulate the refocused spectrum).
2. For each interleave:
    (a) Reconstruct the navigator data in k-space (n×n).
    (b) Zero-pad (a) by a factor of 2 (2n×2n).
    (c) Inverse Fourier transform (b).
    (d) Calculate the phase conjugate of (c).
    (e) Fourier transform (d) (to get the refocusing kernel).
    (f) Reconstruct the high-resolution data frame in k-space at the final image resolution (N×N).
    (g) Convolve (f) with (e) (refocusing step).
    (h) Add (g) to the sum accumulating in step (1).

3. Inverse Fourier transform the cumulative sum from (h) to get the refocused image.

The refocusing kernel must be calculated at twice the navigator bandwidth (step 2b) because normalizing in image-space (step 2d) extends the kernel in k-space. Calculating the kernel at twice the navigator bandwidth avoids Gibbs ringing in the refocused image due to this extension. For every interleave, the k-space algorithm calculates two $2n \times 2n$ Fourier transforms and one convolution of an $N \times N$ matrix with a $2n \times 2n$ kernel. This algorithm runs in approximately $O(CN^2n^2 + Cn^2 \log n^2) \approx O(CN^2n^2)$ time (where constant multipliers have been dropped, as is standard in O-notation).

In most imaging situations, the k-space algorithm will perform better than the image-space algorithm since we will usually have $n^2 < N$. However, this is not always the case, as will be discussed later.

Figure 4:
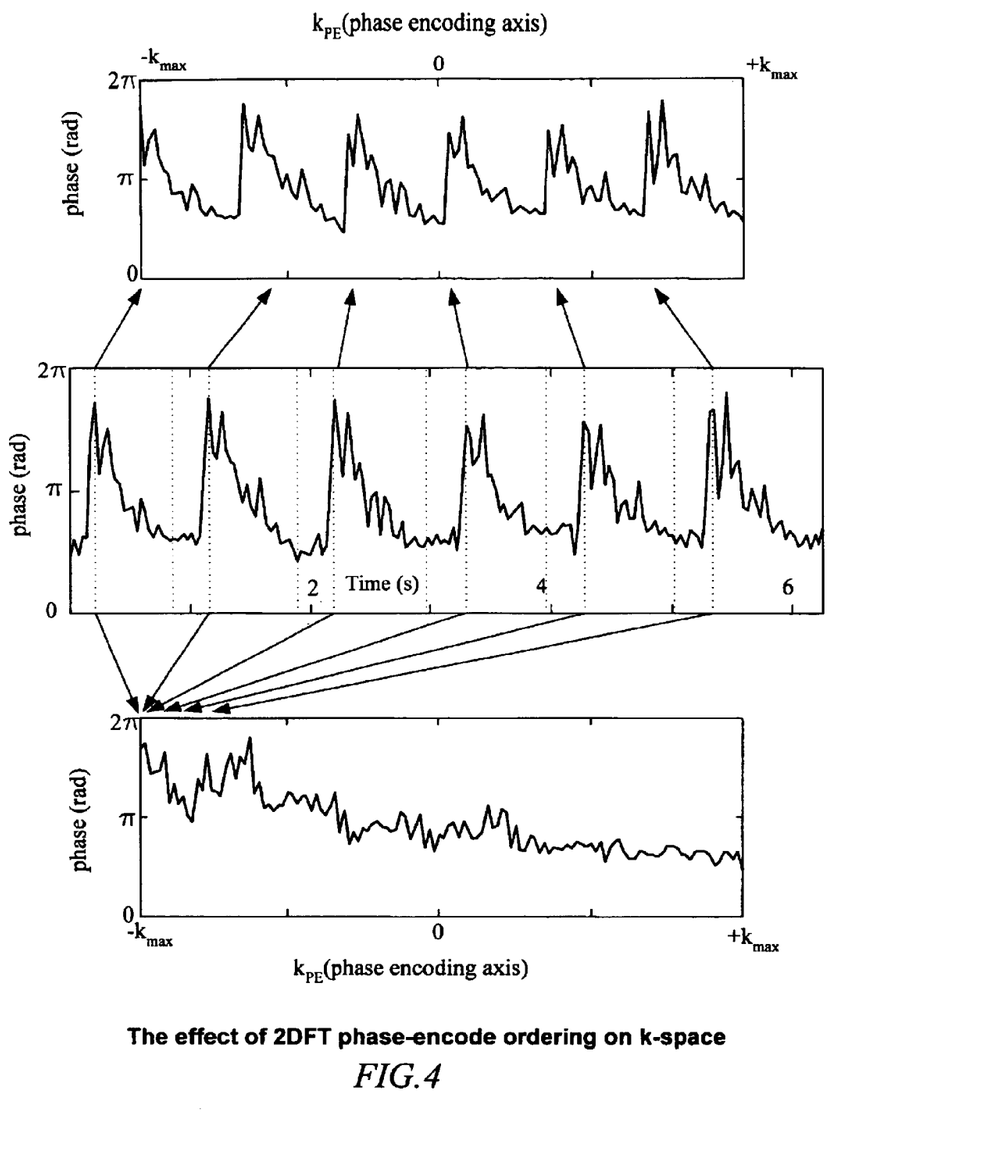
FIG. 4 illustrates the effect of 2DFT phase encode ordering on k-space.

Cardiac triggering or other information regarding the time-varying corruptions can be used to synchronize interleave ordering to reduce discontinuities and periodicities in the k-space data. For example, in a spin-warp trajectory, phase encodes are normally gathered incrementally, resulting in a periodic weighting over k-space with large discontinuities (see FIG. 4a). FIG. 4 illustrates the effect of 2DFT phase encode ordering on k-space in the presence of cardiac-induced phase corruption. The phase history of a representative voxel over time is shown in the middle plot. The gray swathes represent cardiac-gates imaging windows. The k-space modulation imparted by this phase history is shown for (a) standard incremental phase encode ordering and (b) an alternate phase encode order. The latter ordering interleaves the data from different cardiac cycles by choosing a phase encode increment that traverses the extent of k-space during a single cardiac cycle. By interleaving the phase encodes over multiple cardiac cycles in this manner, adjacent lines in k-space are collected at the same portion of the cardiac cycle and the resultant k-space weighting is smooth and non-periodic (FIG. 4b). This method for cardiac synchronization of phase encoding should not require large increases in scan time since data can be acquired throughout a large portion of the cardiac cycle. Cardiac synchronization in this manner reduces the types of k-space modulations that are most problematic for the refocusing reconstruction, discontinuity and periodicity, without incurring the large increases in scan time that usually accompany cardiac gating.

Figure 5:
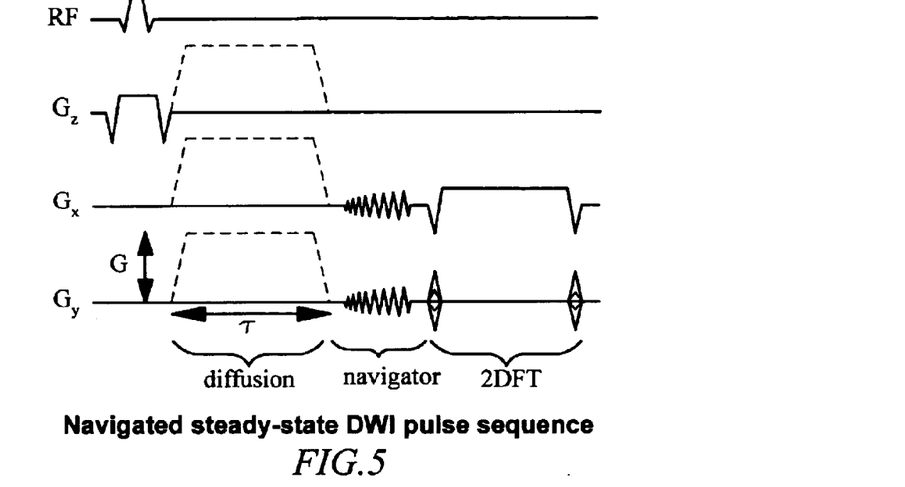
FIG. 5 illustrates a pulse sequence for navigated steady-state DWI.

The invention is demonstrated on DWI of the brain. Brain images were acquired on healthy volunteers with the navigated steady-state diffusion-weighted imaging (SS-DWI) pulse sequence shown in FIG. 5. Here the sequence is fully refocused except for the diffusion gradient (with amplitude G and duration τ), which rephases diffusion-weighted echoes over multiple TRs. To minimize large motions, padding was placed at the subject's temples. The readout consisted of a spiral navigator (FOV=24 cm, 16×16 matrix, 15×15 mm² in-plane, receive BW 62.5 kHz) followed by a spinwarp high-resolution acquisition (FOV=24 cm, 192×192 matrix, 1.25×1.25 mm² in-plane, receive BW 7.8125 kHz). Experiments were performed on a 1.5 T GE Signa CV/i research scanner (General Electric Co., Milwaukee, Wis.) with 40 mT/m gradients switchable at 150 mT/m/ms and a transmit/receive quadrature birdcage head coil. Diffusion-weighted images were acquired using diffusion gradients with G=40 mT/m and τ=6.5 ms ($b_{eff}$=980 s/m m² [19]), which could be applied along any direction. Some studies also acquired an image with minimal diffusion weighting (G=0.3 mT/m and τ=6.5 ms). Other imaging parameters were: TR=40 ms, α=30°, and thickness=6 mm. The sequence was repeated 48 times for a total scan time of 6:15 per image. Approximately 10 subjects have been scanned with variants of this sequence, five of which were scanned with the prescription specified above.

In some experiments, acquisition was synchronized to the cardiac cycle using plethysmographic triggering. To maintain the steady-state, dummy cycles without acquisition were gathered while waiting for cardiac triggers. Following a systolic trigger, data was collected in an interleaved order such that the phase encodes acquired during a single cardiac cycle were evenly distributed across ky-space. This process was repeated for successive cardiac cycles until all phase encodes had been acquired. Additionally, two to three dummy cycles (80–120 ms) were inserted following detection of a trigger to avoid the largest motions associated with systole. Cardiac synchronization usually increased scan times by 1–2 min.

Images were reconstructed using three methods: no correction, the standard linear correction, and the k-space refocusing correction using the invention. Reconstruction of the data was implemented off-line in C code using the FFTW library for Fourier transforms. Both the image-space and k-space versions were implemented; however, all refocused images shown here were calculated with the k-space implementation.

Figure 6:
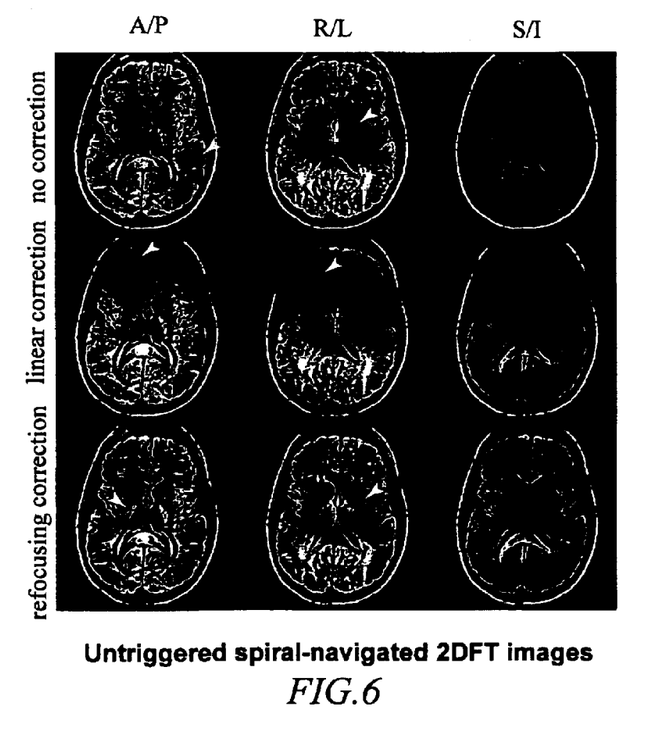
FIG. 6 illustrates untriggered spiral-navigated 2DFT images with varying levels of correction.

The different navigator corrections are compared on untriggered data in FIG. 6, which shows untriggered spiral-navigated 2DFT images with varying levels of correction. Rows (from top to bottom) have no correction, the standard linear correction, and the refocusing correction. Columns (from left to right) show images with diffusion weighting along the A/P, R/L, and S/I directions. Arrows in the A/P- and R/L-weighted uncorrupted images (top row) indicate examples of dephasing due to motion. Arrows in the middle row indicate artifacts introduced by the linear correction. Arrows in the bottom row indicate structures with increased conspicuity after the refocusing correction. Motion-induced phase artifacts interfere to cause signal attenuation in areas with large motions, and little or no artifact outside the object. Motion artifacts are manifested as signal loss rather than the more familiar ghosting artifacts due to the large number of excitations in the acquisition. All of the uncorrected images (top row) are corrupted, with the most serious artifacts in the S/I-weighted image. Arrows in the top row indicate artifacted areas in the RIL- and A/P-weighted images. The linear correction (middle row) restores signal in some corrupted regions (e.g., posterior areas in the S/I-weighted image), but the images remain attenuated in the medial areas where motion is more severe. Additionally, the linear correction introduces attenuation to the frontal lobes in the R/L- and A/P-weighted images due to a poor linear fit to the nonlinear phase artifacts (arrows in middle row of FIG. 6). The refocused images (bottom row) have restored signal and minimal artifacts. In particular, the medial regions show structures that were partially or completely suppressed in the uncorrected images (e.g., the external and internal capsule, indicated by arrows). The images weighted along the primary axis of motion (S/I) have a lower signal-to-noise ratio (SNR) due to the large motions in the S/I direction. In peak systole, these motions cause intravoxel dephasing which cannot be corrected by post-processing.

Figure 7:
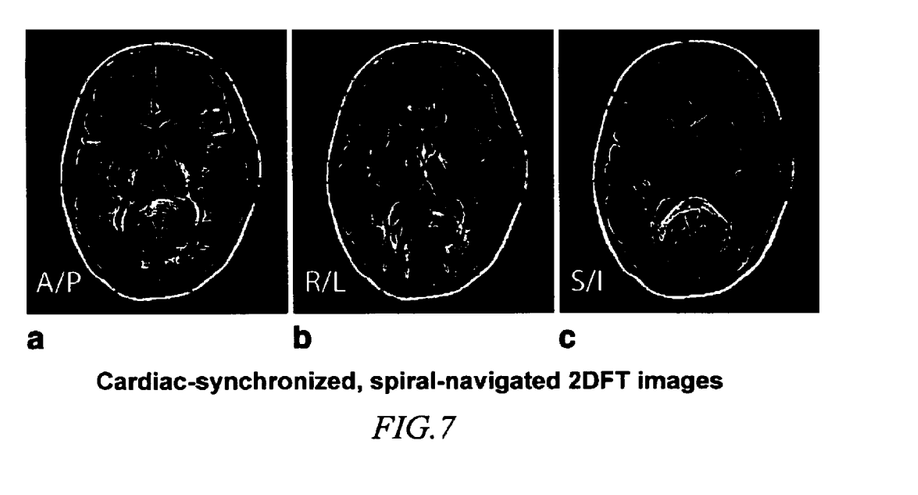
FIG. 7 illustrates cardiac-synchronized spiral-navigated 2DFT images acquired with phase encode interleaving shown in FIG. 4.

A set of refocused images acquired with cardiac synchronization is shown in FIG. 7, which shows cardiac-synchronized, spiral-navigated 2DFT images acquired with the phase encode interleaving scheme shown in FIG. 4. Diffusion-weighting is along the (a) A/P, (b) RIL and (c) S/I directions. These images show strong diffusion contrast with clear delineation of small white matter structures. The S/I-weighted image does not suffer from the degraded SNR seen in untriggered images. The A/P- and R/L-weighted images are also improved with triggering, showing fine detail such as cortical white matter that is less apparent in the untriggered images.

Figure 8:
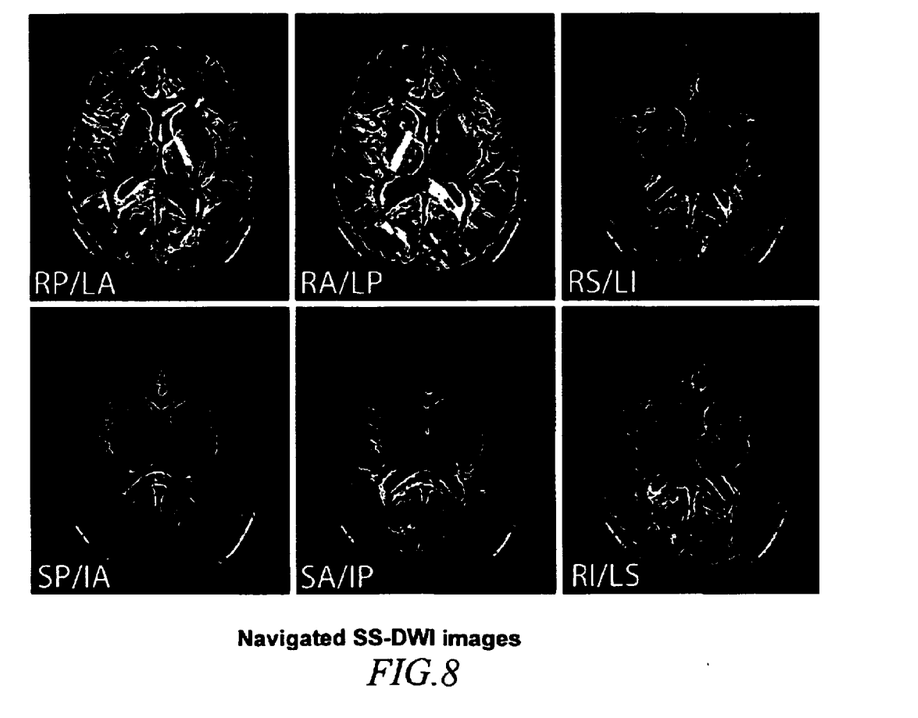
FIG. 8 illustrates navigated SS-WI images acquired with diffusion weighting along standard directions for diffusion tensor.

A fall set of diffusion tensor images acquired with the standard directions for diffusion tensor imaging (DTI) is shown in FIG. 8. In FIG. 8 illustrated are navigated SS-DWI images acquired with diffusion weighting along the standard directions for diffusion tensor. Images are cardiac-synchronized and were reconstructed using the refocusing reconstruction. These images were acquired with cardiac-synchronized phase encode ordering and reconstructed using the refocusing reconstruction. Intravoxel dephasing is minor in these images due to the systolic delay (120 ms) and the fact that diffusion weighting was never applied along the principal axis of brain motion (S/I). Also shown are a trace image and a fractional anisotropy (FA) map for these data before and after correction. These images show strong diffusion weighting with little visible artifact.

There has been presented a method for correction of nonlinear phase corruption. This method does not require additional navigator data beyond that used for 2D linear corrections. Rather, the refocusing correction represents a more complete use of the information in the navigator. The refocusing reconstruction algorithm is straightforward to implement since refocusing is simply a k-space deconvolution that is performed before individual readouts are combined. Alternatively, it can be thought of as image-space multiplication of individual data frames by the navigator phase conjugate.

The least-squares reconstruction is general in the sense that its derivation does not make assumptions about the trajectory or pulse sequence used to gather the data. Although the refocusing reconstruction will not always be a good approximation of the least-squares solution, it is expected to perform well provided the k-space modulation induced by phase corruptions has minimal discontinuity and periodicity. In addition to the 2DFT data shown here, we have used the refocusing reconstruction for self-navigated spiral data with similar results. Pipe and colleagues have also had good success using a refocusing reconstruction with an FSE PROPELLER sequence (however, in their case, the refocusing reconstruction is the same as the least-squares reconstruction since each readout is unaliased).

While full least-squares reconstruction is generally intractable due to the inversion of the mixing matrix, it may be manageable in special cases or with efficient approximations. For example, the mixing matrix M will be block diagonal and sparse for trajectories in which the signal from a voxel can only alias onto a subset of the other voxels (see Appendix B). In this case, the matrix inversion of M can be calculated by individually inverting the smaller block sub-matrices. In our experience, this calculation is still very time-consuming. Alternatively, the mixing matrix could be approximated with an iterative scheme similar to that proposed for multi-coil reconstructions.

Figure 9:
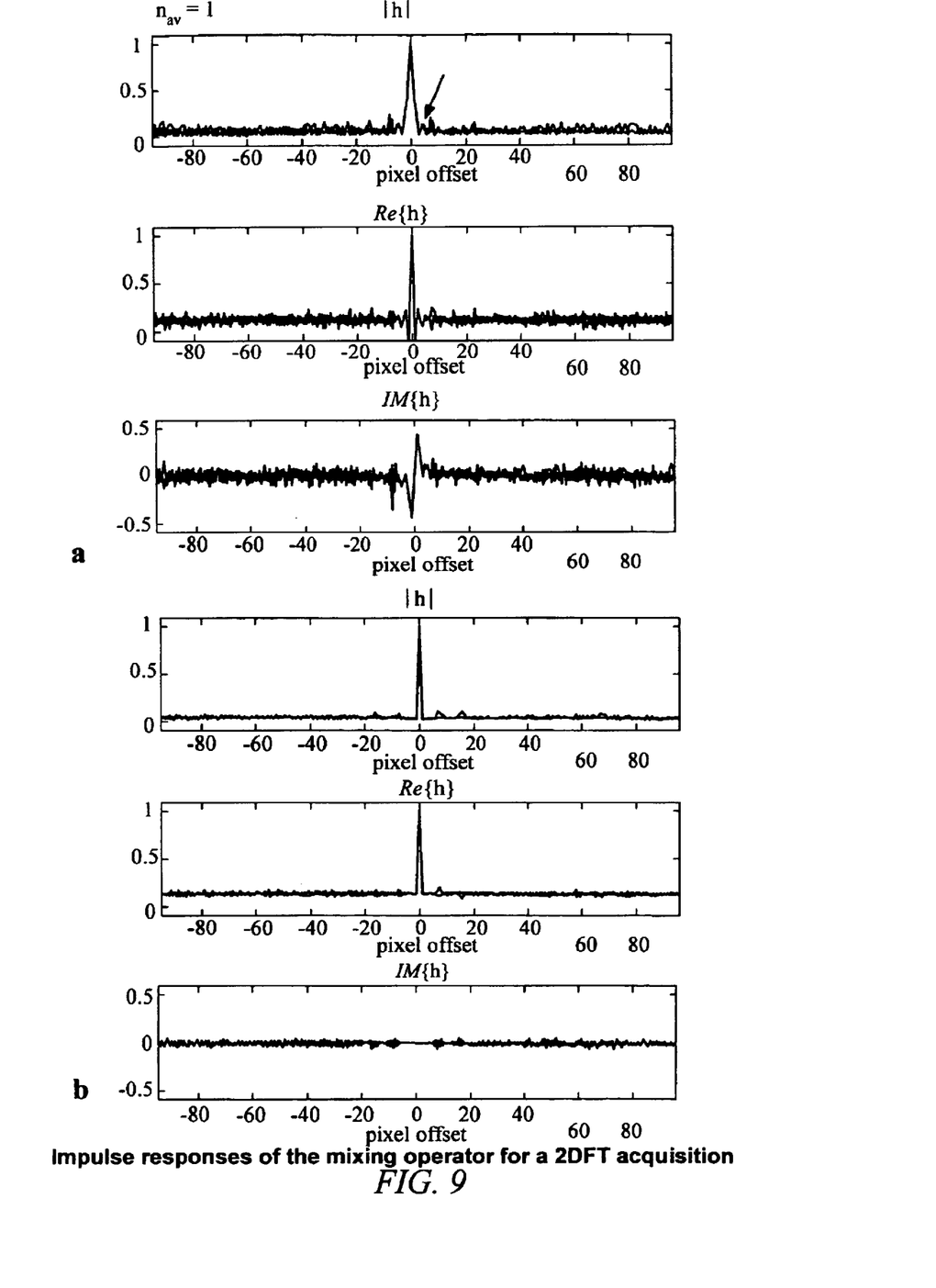
FIG. 9 illustrates impulse responses of a mixing operator for a 2DFT acquisition with (a) no averaging and (b) 4 averages.

FIG. 9 illustrates impulse responses of the mixing operator for a 2DFT acquisition with (a) no averaging and (b) 4 averages. Each subfigure overlays the impulse responses for the same 10 voxels taken from a representative navigator data set. The arrow in (a) indicates coherences in the mixing impulse responses which lead to coherent ghosts. Averaging in (b) suppresses much of the off-peak energy. The impulse response of the mixing operator is a useful way to characterize the fidelity of the refocused image. The off-peak power in the impulse response indicates the amount of aliased energy in the refocused image and therefore the relative benefit of applying the unmixing operator. Of particular interest are coherences in the voxel impulse responses, which indicate coherent ghosts in the refocused image. The impulse response of the mixing operator is shown in FIG. 9a for several representative voxels in an ungated data set. Although there is significant energy off-center, most of the aliased signal has random phase and will add incoherently. The impulse responses also show widening of the central peak and coherent off-center peaks, which will lead to blurring and ghosting, respectively. These effects in the impulse response must be reduced in order for the refocusing operator to provide accurate reconstructions.

The quality of the refocusing reconstruction is dependent on the number of excitations that make up an image. Aliased energy in the refocused image decreases as the number of excitations increases since the incoherent sources of aliasing are sampled more often. As shown in FIG. 9b, averaging suppresses the incoherent off-peak energy found in unaveraged data. In this case, averaging also suppresses the coherent peaks since data were acquired asynchronous to the cardiac cycle. Some averaging is always necessary to correct strong phase corruptions, which warp the k-space trajectory. Acquiring multiple averages ensures that the perturbed encoding functions will cover k-space more fully. One side effect of this need to average is the improvement of the refocusing reconstruction.

The need for cardiac gating has been a common criticism of navigator methods. Since linear corrections assume rigid-body motion, cardiac gating is required to limit imaging to the more stable portions of the cardiac cycle in which motions are better approximated as linear. With the nonlinear corrections introduced here, post-systolic delays only have to be long enough to avoid intravoxel dephasing during peak systole which cannot be corrected in post-processing. For the 2DFT SS-DWI sequence used here, cardiac synchronization requires only moderate increases in scan time (25–33%). This imaging efficiency is possible because cardiac information is being used to synchronize the acquisition to the cardiac cycle, rather than simply limiting the portion of the cardiac cycle in which data is gathered.

Figure 10:
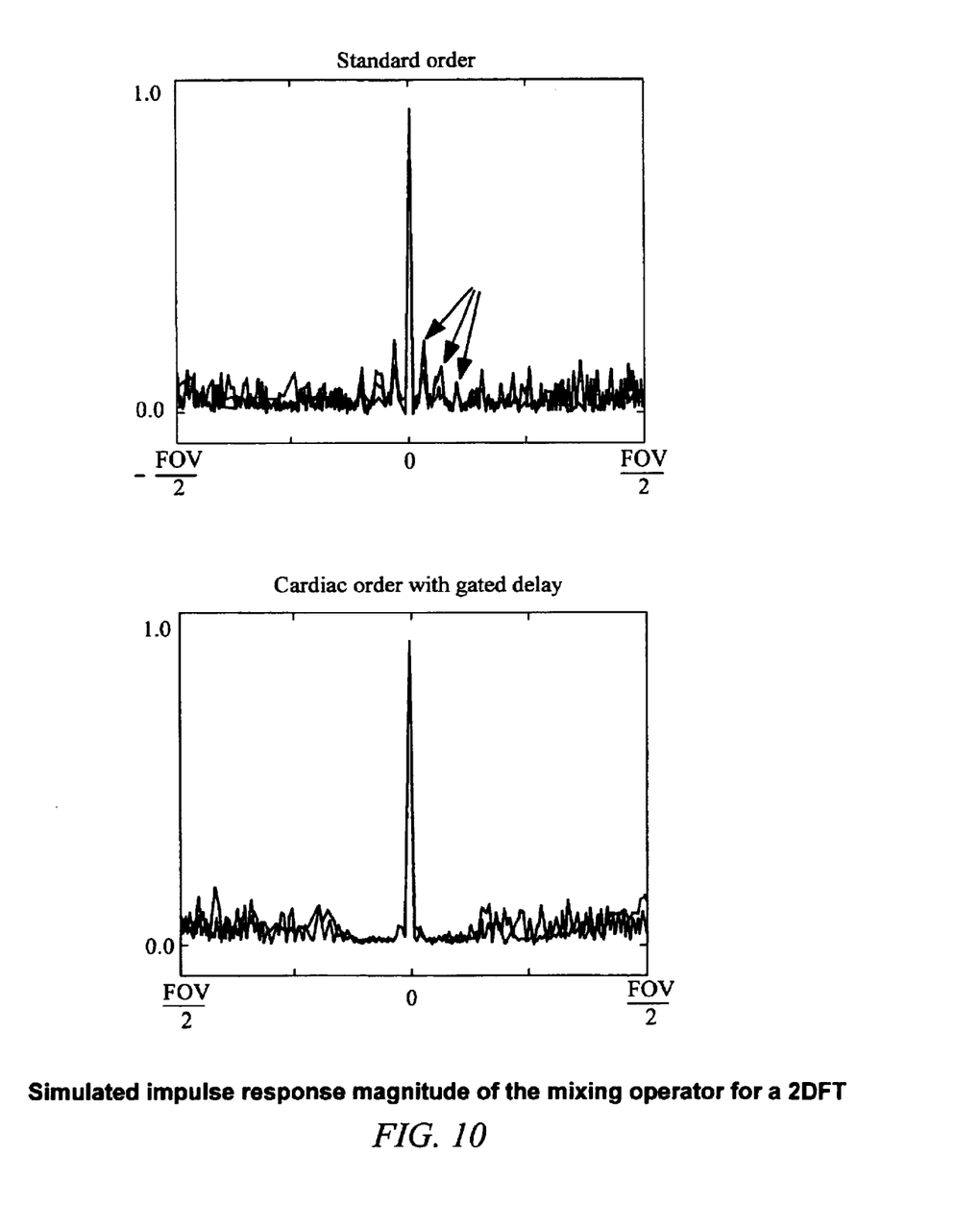
FIG. 10 illustrates simulated impulse response magnitude of the mixing operator for a 2DFT acquisition with and without cardiac synchronization.

FIG. 10 illustrates simulated impulse response magnitude of the mixing operator for a 2 DFT acquisition for with and without cardiac synchronization ($n_{av}$=1). (a) The impulse responses for standard incremental order have strong coherences (arrows) that will lead to ghosting. (b) These coherences are eliminated when cardiac-synchronized phase-encode ordering is used. Improvements to the refocused image due to cardiac synchronization can be seen by examining the impulse response of the mixing operator. The impulse response for the standard phase-encode ordering scheme (FIG. 10a) has significant off-peak energy as well as a series of coherent peaks (arrows) due to the periodic weighting of k-space introduced by the cardiac cycle (several harmonics are clearly visible). Cardiac-synchronized ordering (FIG. 10b) eliminates off-center coherent peaks and produces a more well-behaved impulse response. The attenuation band around the impulse is due to the suppression of low frequencies in the k-space modulation.

Although functionally equivalent, the image-space and k-space refocusing reconstructions differ in terms of computational efficiency. The choice of algorithm depends on the relative sizes of the navigator and high-resolution acquisitions, as well as the details of the high-resolution trajectory. However, in almost all practical imaging scenarios, the k-space implementation is expected to outperform the image-space algorithm. As presented above, the k-space algorithm will perform better if $n^2 < N$ because the k-space convolution will be faster than the large matrix multiply.

An additional consideration in the comparison of the two methods is the specific k-space trajectory used for the high-resolution acquisition. Our previous analysis of the k-space algorithm assumed that the convolution must be performed over the entire N×N matrix, which is not true for all trajectories. For some trajectories, the convolution time can be significantly reduced by performing a local convolution. For example, with a spinwarp trajectory, the convolution need only include the area around each phase encode line, and can therefore be performed in $O(Nn^2)$ time. For this trajectory, the k-space algorithm will in general perform better when n<N, which should always be the case.

Thus far only 2D acquisitions have been considered. For 3D acquisitions, all 2D FFTs, matrix multiplications, and convolutions are replaced with 3D operations. The k-space algorithm is expected to scale more favorably than the image-space algorithm for 3D acquisitions since a local 3D convolution can be performed significantly faster than large 3D Fourier transforms and matrix multiplications can be calculated. Early work with 3D SS-DWI knee imaging used a k-space algorithm with good results. For this application, the image-space algorithm was found to be prohibitively slow.

Previous work on navigated DWI usually included a weighting or thresholding of data frames that are suspected to contain uncorrectable phase artifacts. The method in accordance with the invention does not have to include such a correction, primarily because it has not proven necessary under the current imaging circumstances. However, imaging methods that acquire fewer data frames are more impacted by artifacted data frames, and might benefit from a weighting scheme.

Examining FIG. 1, it is seen that during periods of the most intense motion (such as systole), navigator images exhibit signal loss due to intravoxel dephasing. Navigator magnitude can thus be used as an indicator of uncorrectable phase corruption and can be incorporated into the reconstruction. If we weight each image-space sample by its navigator magnitude prior to correction, the least-squares estimate will be biased to more reliable data. This can be accomplished by solving the preconditioned problem:

$$Qd = QRPm \quad (4).$$

where Q is a preconditioning matrix that accomplishes the desired image-space weighting. Note that preconditioning is applied to the problem in k-space.

The least-squares solution to Eq. 4 is:

$$\hat{m}_Q = (P^*R^*Q^*QRP)^{-1} P^*R^*Q^*Qd \quad (5).$$

The estimate in Eq. 5 filters the k-space data by $Q^*Q$ prior to refocusing. The magnitude effects of the filter are then removed by the unmixing matrix $(P^*R^*Q^*QRP)^{-1}$. To weight each image-space voxel by the navigator magnitude, $Q^*Q$ must convolve each high-resolution interleave with the Fourier transform of the navigator magnitude. In other words, $R^*Q^*Qd$ should contain the interleave images weighted by the navigator magnitude.

A weighted refocusing reconstruction can then be defined by approximating the mixing matrix $P^*R^*Q^*QRP$ as diagonal by zeroing the off-diagonal elements. The approximated unmixing matrix removes the weighting caused by the preconditioning but does not attempt to remove any aliasing. Regularizing can be used to improve the stability of the inversion in noise regions with low signal.

The refocusing reconstruction will provide a good reconstruction of the data provided (a) a large number of excitations are acquired, and (b) k-space modulations induced by motion are smooth and nonperiodic.

The requirement for many excitations minimizes aliasing energy by allowing the incoherent phase errors to cancel. The improvement in the refocused image from averaging is discussed above; other methods of increasing the number of excitations will have the same effect. For example, a 3D acquisition should be better-conditioned to a refocusing reconstruction than a 2D multi-slice acquisition. Simply increasing the number of interleaves in an acquisition will also improve the refocused image. The need for a large number of excitations is a disadvantage for some sequences, such as spin echo, which require long echo times. These methods may benefit from a weighted refocusing reconstruction which will tend to suppress these errors, particularly if regularization is used.

The requirement for smooth and non-periodic k-space modulations ensures that the refocusing operator will be able to remove phase corruptions. This requirement can be addressed in most trajectories with cardiac synchronization. Some trajectories cannot simultaneously achieve smoothness and non-periodicity, in which case the smoothness constraint should be preferentially met since the refocusing reconstruction does a poor job of removing discontinuities. Spiral and radial scans can achieve a smooth k-space weighting by distributing the rotated interleaves from 0° to 180° over each cardiac cycle (this scheme would result in azimuthal periodicity in k-space). Segmented EPI scans can also be made smooth by acquiring each segment of a single image at roughly the same portion of the cardiac cycle. The cardiac cycle could then be filled out by acquiring more slices (in multi-slice), more z-phase encodes (for 3D), or more averages. All of these methods use cardiac information to achieve well-behaved modulations of the k-space data without requiring large increases in scan time.

There has been presented a method for correcting non-linear phase errors in diffusion-weighted imaging using 2D navigation. The refocusing reconstruction, which is an approximation to the computationally-expensive least-squares estimate, is a straightforward algorithm that makes complete use of the information in a 2D navigator. The heart of the reconstruction is the refocusing operator, which rephases the unaliased component of each acquisition. This reconstruction is a good approximation to the full least-squares estimate provided the phase errors cause smooth, non-periodic modulations of k-space, and a sufficient number of excitations are acquired. Cardiac triggering information can be used to achieve desirable modulations through ordering of data interleaves. The refocusing reconstruction is expected to be applicable in a wide range of imaging conditions.

While the invention has been described with reference to specific embodiments, the description is illustrative of the invention and is not to be construed as limiting the invention. Various modifications and applications may occur to those skilled in the art without departing from the true scope and spirit of the invention as defined by the appended claims.

What is claimed is:

1. A method of correcting data frames for dynamic phase errors in magnetic resonance imaging comprising the steps of:

a) acquiring a plurality of high-resolution data frames, b) acquiring with each high-resolution data frame a low-resolution phase reference navigator, and c) rephasing each high-resolution data frame in k-space with a convolution with the Fourier transform of the phase conjugate of the low-resolution phase reference navigator.

2. The method as defined by claim 1 wherein step c) includes the steps of:

c1) calculating for each data frame a Fourier transform of a phase conjugate of the phase reference navigator as a refocusing kernel for the data frame, and c2) convolving in k-space the high-resolution data frame with the refocusing kernel to phase correct the high-resolution data frame.

3. The method as defined by claim 2 wherein step c) utilizes a gridding reconstruction of each high-resolution data frame.

4. The method as defined by claim 3 wherein the acquired MRI data, d, is:

$$d=GFPm=RPm$$

where d is a C R×1 vector containing the k-space data, m is a $N^2 \times 1$ vector containing the object magnetization in Cartesian coordinates, and P ($CN^2 \times N^2$), F ($CN^2 \times CN^2$) and G ($CR \times CN^2$) are matrices respectively representing image-space phase corruption, discrete Fourier transform, and resampling from a Cartesian grid onto the k-space trajectory, and R is length of k-space interleaved trajectories.

5. The method as defined by claim 4 wherein the reconstructed image is a least squares estimate:

$$\hat{m}=(P^*R^*RP)^{-1}P^*R^*d=M^{-1}P^*R^*d$$

where * denotes conjugate transpose.

6. The method as defined by claim 5 wherein the least squares reconstruction is estimated as:

$$\tilde{m}=P^*R^*d.$$

7. The method as defined by claim 6 wherein k-space refocusing of each data frame includes:

A) initialize a zero-filled N×N matrix which will accumulate the refocused spectrum, B) for each interleave:

a') Reconstruct the navigator data in k-space (n×n), b') Zero-pad (a) by a factor of 2(2n×2n), c') Inverse Fourier transform (b), d') Calculate the phase conjugate of (c), e') Fourier transform (d) to get the refocusing kernel, f') Reconstruct the high-resolution data frame in k-space at the final image resolution(N×N), g') Convolve (f) with (e) (refocusing step), h') Add (g) to the sum accumulating in step A), C) inverse Fourier transform the cumulative sum from (h) to get a refocused image.

8. The method as defined by claim 7 wherein step a') and step b') include acquiring information relevant to time-varying data corruption, and ordering of data frames based on this information thereby promoting smooth, non-periodic modulation of data in the spectral domain.

9. The method as defined by claim 7 and further including before step (c') the step of:

(b1) weighting each image-space sample in the plurality of data frames by magnitude of the low-resolution phase reference navigator acquired therewith.

10. The method as defined by claim 9 wherein $$Qd=QRPm$$

where Q is a preconditioning matrix that provides desired image-space weighting.

11. The method as defined by claim 10 wherein least-squares solution, $\hat{m}_Q$, is given by:

$$\hat{m}_Q=(P^*R^*Q^*QRP)^{-1}P^*R^*Q^*Qd.$$

12. The method as defined by claim 1 and further including the step of:

d) summing the phase-corrected high resolution data frames.

* * * * *